(12) United States Patent
Kobayakawa et al.

(10) Patent No.: US 7,453,091 B2
(45) Date of Patent: Nov. 18, 2008

(54) GALLIUM NITRIDE-BASED SEMICONDUCTOR DEVICE

(75) Inventors: Masato Kobayakawa, Ichihara (JP); Hideki Tomozawa, Ichihara (JP); Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/591,585

(22) PCT Filed: Mar. 3, 2005

(86) PCT No.: PCT/JP2005/004140

§ 371 (c)(1),
(2), (4) Date: Jan. 25, 2007

(87) PCT Pub. No.: WO2005/086242

PCT Pub. Date: Sep. 15, 2005

(65) Prior Publication Data

US 2007/0187693 A1    Aug. 16, 2007

Related U.S. Application Data

(60) Provisional application No. 60/553,125, filed on Mar. 16, 2004.

(30) Foreign Application Priority Data

Mar. 4, 2004   (JP)   ............................. 2004-060495

(51) Int. Cl.
*H01L 29/26*   (2006.01)

(52) U.S. Cl. ............................ 257/79; 257/99; 257/103; 257/94; 257/E33.023; 257/E33.049

(58) Field of Classification Search ................. 257/613, 257/615, E33.023, E33.049, E27.012, 79, 257/94, 99, 103
See application file for complete search history.

(56) References Cited

U.S. PATENT DOCUMENTS

| 5,306,662 | A | 4/1994 | Nakamura et al. |
| 6,297,442 | B1 * | 10/2001 | Yagi et al. ................... 136/256 |
| 6,365,923 | B1 | 4/2002 | Kamei |
| 6,429,102 | B1 | 8/2002 | Tsai et al. |

FOREIGN PATENT DOCUMENTS

| CA | 1077812 | 5/1980 |
| JP | 53-20882 | 2/1978 |
| JP | 54-71590 | 6/1979 |
| JP | 55-3834 | 1/1980 |
| JP | 6-237012 | 8/1994 |

(Continued)

*Primary Examiner*—Cuong Quang Nguyen
*Assistant Examiner*—Trang Q Tran
(74) *Attorney, Agent, or Firm*—Sughrue Mion, PLLC

(57) ABSTRACT

A gallium nitride-based semiconductor device has a p-type layer that is a gallium nitride compound semiconductor layer containing a p-type impurity and exhibiting p-type conduction. The p-type layer includes a top portion and an inner portion located under the top portion. The inner portion contains the p-type impurity element and, in combination therewith, hydrogen.

8 Claims, 1 Drawing Sheet

FOREIGN PATENT DOCUMENTS

| | | |
|---|---|---|
| JP | 8-116089 A | 5/1996 |
| JP | 9-266218 A | 10/1997 |
| JP | 11-150296 A | 6/1999 |
| JP | 11-177133 A | 7/1999 |
| JP | 2002-203798 A | 7/2002 |
| JP | 2002-324913 A | 11/2002 |
| JP | 2003-243302 | 8/2003 |
| TW | 329058 | 4/1998 |
| TW | 502457 | 9/2002 |
| TW | 516101 | 1/2003 |

* cited by examiner

GALLIUM NITRIDE-BASED SEMICONDUCTOR DEVICE

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/553,125 filed Mar. 16, 2004 pursuant to 35 U.S.C. §111(b).

TECHNICAL FIELD

The present invention relates to a gallium nitride-based semiconductor device having a p-type gallium nitride semiconductor layer, such as a light-emitting diode (LED), a laser diode (LD) or a pin-type photodetector.

The method for fabricating the p-type Group III semiconductor according to the present invention is applicable to the fabrication of any kind of semiconductor device including various kinds of high-speed transistors and photodetectors, besides semiconductor light-emitting devices including light-emitting diodes and laser diodes, requiring a p-type Group III nitride semiconductor. Of these semiconductor devices, the method of the present invention can advantageously be used for the fabrication of semiconductor light-emitting devices requiring formation of a pn junction and formation of a positive electrode having good characteristics.

One example of the structure of the Group III nitride semiconductor light-emitting device fabricated in accordance with the method of the present invention will be described. On a substrate an n-type Group III nitride semiconductor layer, a light-emitting layer and a p-type semiconductor layer are sequentially deposited via a buffer layer, if necessary, and a negative electrode and a positive electrode are provided respectively on the n-type semiconductor layer and the p-type semiconductor layer. Here, the p-type semiconductor layer constituting the uppermost layer has the structure described in connection with the present invention.

Sapphire, SiC, GaN, AlN, Si, ZnO or other oxides, and other materials known to the art can be used without any modification as the material for the substrate. Of these, sapphire is preferred. The buffer layer is provided, when necessary, to adjust lattice mismatch between the substrate and the n-type semiconductor layer grown thereon.

The composition and structure of the n-type semiconductor layer may be modified to desirable ones in accordance with the prior art known to the technical field concerned. Generally, the n-type semiconductor layer comprises a contact layer acquiring good ohmic contact with the negative electrode and a cladding layer having a larger energy bandgap than the light-emitting layer. The negative electrode may be modified to have a desirable composition and structure using the prior art known to the technical field concerned.

The light-emitting layer may also have any composition and any structure known to the art without making any restrictions, such as a single quantum well (SQW) structure, multi-quantum well (MQW) structure, etc.

The p-type semiconductor layer is formed through the method of the present invention. The composition and structure thereof may be modified to desirable ones using the prior art well known to the technical field concerned. Generally, the p-type semiconductor layer comprises a contact layer acquiring hood ohmic contact with the positive electrode and a cladding layer having a larger energy bandgap than the light-emitting layer.

Te material for the positive electrode in contact with the p-type layer fabricated through the method of the present invention includes Au, Ni, Co, Cu, Pd, Pt, Rh, Os, Ir, Ru and other such metal and may further contain transparent oxides, such as ITO, NiO, CoO, etc. The transparent oxides may be contained in a film of the metal mentioned above in the form of a mass or overlapped with the metal film in a stratified form.

When using the present invention particularly in case where platinum group metal, such as Pd, Pt, Rh, Os, Ir, Ru, etc., is adopted as the material for the positive electrode, an increase in operation voltage owing to the heat generated during bonding can be prevented. Thus, a considerable effect is manifested. Of the metals, high-pure Pd, Pt and Rh are available on the market relatively with ease and can readily be used.

The material to be brought into contact with the p-type layer fabricated according to the method of the present invention may include transparent materials, such as ITO, ZnO, SnO, InO and the like. Since these transparent conductive materials exhibit better translucency in general than a thin metal film, they are materials intended for relatively positive use as a transparent electrode.

Since the conduction type of these materials is an n-type, however, no ohemic contact has heretofore been produced from contact between any of the n-type materials and a p-type GaN layer. Use of the technique of the present invention set forth in the appended claims enables ohimi contact with any of the conductive transparent materials to be materialized.

The positive electrode may be formed to cover the substantially entire surface of the contact layer or formed in a latticed or tree form. While the positive electrode thus formed may be subjected to thermal annealing for the purpose of converting it into an alloy electrode or a transparent electrode, this is not limitative.

The device may be brought to a so-called faceup (FU) mode that fetches emission from the semiconductor side using a transparent positive electrode or to a so-called flip-chip (FC) mode that fetches emission from the substrate side using a reflection type positive electrode.

BACKGROUND ART

Conventionally, gallium nitride (GaN)-based semiconductor materials represented by a compositional formula, such as $Al_xGa_yIn_zN$ ($0 \leq X, Y, Z \leq 1$; $X+Y+Z=1$), and having a direct-transition-type bandgap of energy corresponding to a wavelength region of short-wavelength visible light to the UV region have been employed for fabricating pn-junction light-emitting devices, such as blue, green or UV LEDs and LDs (see, for example, JP-B SHO 55-3834).

Conventionally, the p-conduction-type GaN semiconductor layer for fabricating a pn-junction gallium nitride-based semiconductor light-emitting device is formed through addition of an element belonging to Group II of the periodic table serving as a p-type impurity (i.e., Group II impurity). For example, there has been disclosed a technique in which a Group II impurity, such as magnesium (Mg) or zinc (Zn), is added to a GaN layer through ion injection means (see, for example, JP-A SHO 54-71590).

However, without any further treatment, the gallium nitride-based semiconductor layer to which a Group II impurity has been added generally does not serve as a p-type conductive layer exhibiting high conductivity. One conceivable reason for this is that hydrogen (H) migrating from a growth atmosphere to the layer during vapor phase growth electrically compensates the Group II impurity, thereby deactivating the impurity. Thus, according to a conventional procedure, a gallium nitride-based semiconductor layer is formed through addition of a Group II impurity to the layer, followed by heating the layer in order to remove, as much as possible, hydrogen contained in the layer (see, for example, JP-A HEI 6-237012). Another known technical approach is irradiation with charged particles for electrically activating a Group II impurity (see, for example, JP-A SHO 53-20882).

Even when virtually the entire amount of hydrogen is removed from the GaN semiconductor layer to which a p-type Group II impurity has been added, the thus obtained low-resistance p-type conductor layer does not necessarily attain excellent, reliable rectifying characteristics and electrostatic blocking voltage characteristics when a pn-junction LED is fabricated therefrom. Among these characteristics, currently, consistent electrostatic blocking voltage is difficult to attain, even when the p-type GaN-based semiconductor layer is formed on a conductive substrate, such as a silicon (Si) single-crystal substrate, silicon carbide (SiC) substrate or gallium arsenide (GaAs) substrate.

An object of the present invention is to improve electrostatic blocking voltage of a gallium nitride-based semiconductor device, such as an LED, fabricated from the aforementioned conventional p-type GaN-based semiconductor layer by minimizing variation of blocking voltage and suppressing increase in resistance to as small an increase as possible.

DISCLOSURE OF THE INVENTION

The present invention has been accomplished in order to attain the aforementioned object and provides a gallium nitride-based semiconductor device having a p-type layer that is a gallium nitride compound semiconductor layer containing a p-type impurity and exhibiting p-type conduction, wherein the p-type layer comprises a top portion and an inner portion located under the top portion and wherein the inner portion contains the p-type impurity element and, in combination therewith, hydrogen.

In the gallium nitride-based semiconductor device, the p-type impurity is incorporated in the p-type layer by means of doping or ion injection.

In the first or second mentioned gallium nitride-based semiconductor device, the inner portion of the p-type layer has a ratio of atomic concentration of the hydrogen to that of the p-type impurity of about 1:1.

In the first or third mentioned gallium nitride-based semiconductor device, the inner portion of the p-type layer has a percent thickness of 40% to 99.9% with respect to a total thickness of the p-type layer.

In the fourth mentioned gallium nitride-based semiconductor device, the inner portion of the p-type layer has a percent thickness of 70% or more with respect to the total thickness of the p-type layer.

In any one of the first to fifth mentioned gallium nitride-based semiconductor devices, the top portion of the p-type layer has a hydrogen content that is ⅓ or less the amount of the hydrogen contained in the inner portion.

In any one of the first to fifth mentioned gallium nitride-based semiconductor devices, the top portion of the p-type layer has a hydrogen content that is ½ or less the amount of the hydrogen contained in the inner portion.

In any one of the first to fifth mentioned gallium nitride-based semiconductor devices, the top portion of the p-type layer has a hydrogen content that is ⅔ or less the amount of the hydrogen contained in the inner portion.

In any one of the first to fifth mentioned gallium nitride-based semiconductor devices, the top portion of the p-type layer has a hydrogen content that is less than the amount of the hydrogen contained in the inner portion.

According to the present invention, a GaN-based semiconductor device is fabricated from a p-type GaN semiconductor layer having a p-type layer including a high-resistance inner potion that contains a p-type impurity and hydrogen in an amount falling within a specific range. Therefore, a GaN-based semiconductor LED exhibiting excellent electrostatic blocking voltage characteristics can be produced.

In addition, a GaN-based semiconductor device is fabricated from a p-type GaN-based semiconductor layer including a high-resistance inner portion in which hydrogen is caused to remain, and a low-resistance upper layer (a top portion) formed on the inner portion, the hydrogen content of the top portion preferably being ⅓ or less that of the inner portion. Therefore, there can be produced a GaN-based semiconductor LED exhibiting excellent electrostatic blocking voltage characteristics and lower forward voltage as compared with the case in which the entirety of the p-type layer has the same hydrogen concentration as that of the inner portion.

The above and other objects, characteristic features and advantages of the present invention will become apparent to those skilled in the art from the description to be made herein below with reference to the accompanying drawing.

BEST MODES FOR CARRYING OUT THE INVENTION

Figure 1:
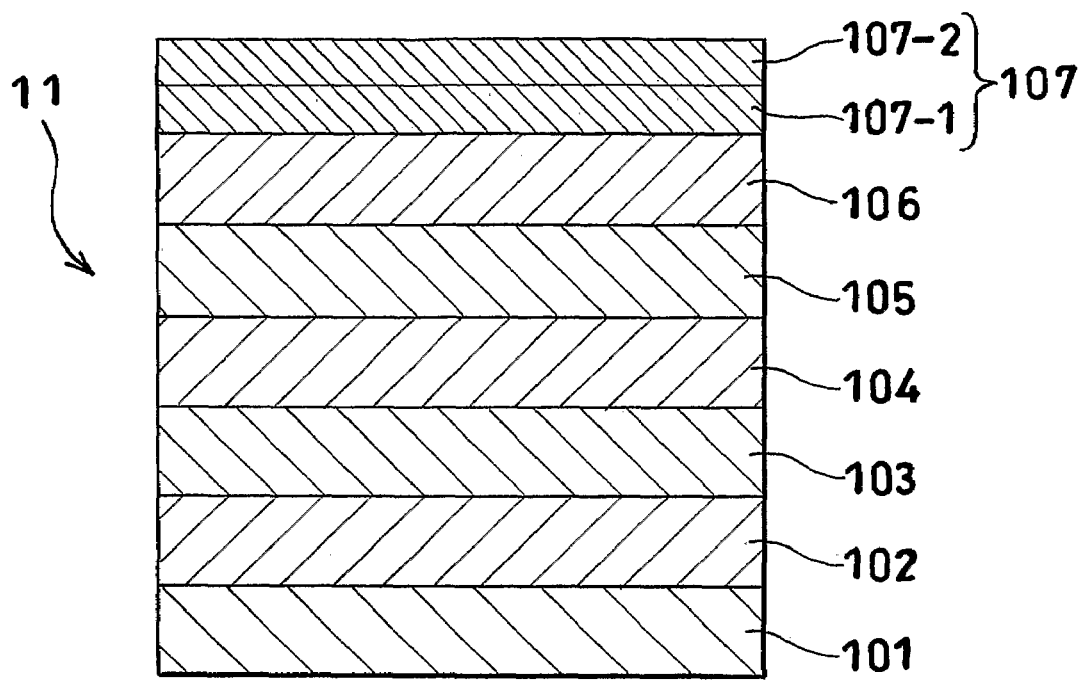
FIG. 1 is a schematic cross-sectional view showing the layer constitution of the stacked structure described in Example 1.

The gallium nitride-based semiconductor device of the present invention has a p-conduction-type gallium nitride (GaN) compound semiconductor layer (p-type layer), wherein the p-type layer comprises a top portion and an inner portion located under the top portion and wherein the inner portion contains a p-type impurity and hydrogen in an amount falling within a specific range. Other components constituting the semiconductor device may be fabricated from conventionally known device components without any modification.

The substrate of the semiconductor device is preferably a crystalline substrate, desirably a single-crystal substrate. Examples of the substrate material include sapphire, cubic SiC and hexagonal SiC. Single crystals of gallium phosphide (GaP), GaAs, silicon, zinc oxide (ZnO) and GaN may also be employed. When the p-type layer is stacked on a lattice-mismatch crystalline substrate, a lattice-mismatch crystal epitaxial growth technique, which is called seeding process (SP) (JP-A 2003-243302), is advantageously employed.

The p-type layer may be grown on a substrate through vapor phase growth means, such as molecular-beam epitaxy (MBE), metal-organic chemical vapor deposition (MOCVD) and hydride vapor phase epitaxy (HVPE). Regarding nitrogen sources for forming the GaN-based semiconductor layer, ammonia, hydrazine, an azide or a similar compound may be used. Examples of the Group III organometallic source which may be employed include trimethylgallium, triethylgallium, trimethylindium and trimethylaluminum.

Examples of the p-type impurity (dopant) to be added during vapor phase growth of the p-type layer include Group II elements, such as Mg, zinc (Zn), beryllium (Be), calcium (Ca), strontium (Sr), barium (Ba), cadmium (Cd) and mercury (Hg). Amphoteric impurities belonging to Group IV (e.g., carbon (C)) may also be used. Among them, a Group II element, such as Mg, is preferably used as a p-type impurity. The p-type impurity, such as Mg, is preferably added to the p-type layer at an atomic concentration of $5\times10^{18}$ cm$^{-3}$ to $1\times10^{20}$ cm$^{-3}$. The impurity concentration is virtually uniform in the p-type layer (i.e., the inner portion and the upper layer (top portion)). The p-type impurity concentration of the p-type layer may be determined through conventional analysis means, such as secondary ion mass spectrometry (SIMS) or Auger electron spectroscopy (AES).

No particular limitation is imposed on the sort of the p-type layer of the present invention, and a p-type GaN-based layer, such as a p-type GaN cladding layer or a p-type GaN contact layer may be employed. At least one p-type GaN layer may be applied to the p-type layer of the present invention.

The p-type layer including an inner portion generally has a total thickness of 0.5 µm or less, preferably 0.2 µm or less, more preferably 0.1 µm or less. The lower limit of the layer thickness is preferably about 1 nm. The total thickness of the p-type layer may be controlled by modifying the time for feeding a Group III element source to the growth system during vapor phase growth. The total thickness of the p-type layer may be determined through observation under an optical microscope, a scanning electron microscope (SEM), a transmission electron microscope (TEM), etc.

According to the present invention, hydrogen is caused to remain in the inner portion of the p-type layer having the aforementioned thickness. The aforementioned range corresponds to, for example, the range of resistance of about 10 µΩ or less. The term "inner portion" is a portion located under the top surface of the p-type layer and corresponds to the contact layer 107-1 shown in FIG. 1. The inner portion in which hydrogen is caused to remain preferably has a ratio of atomic concentration of remaining hydrogen to that of the p-type impurity of about 1:1. Thus, the hydrogen concentration is preferably almost equivalent to the aforementioned impurity concentration; i.e., $5\times10^{18}$ cm$^{-3}$ to $1\times10^{20}$ cm$^{-3}$. The hydrogen concentration is controlled for the purpose of quantitative formation of an electrically inactive complex from the p-type impurity and remaining hydrogen in the region. The top portion of the p-type layer preferably has a hydrogen concentration which is ⅓ or less the hydrogen concentration of the inner portion. Since the impurity concentration of the inner portion and that of the top portion are almost equivalent to each other, the hydrogen concentration of the top portion becomes ⅓ or less (atomic ratio) the impurity concentration of the top portion. The p-type impurity concentration (atomic) and the hydrogen concentration (atomic) may be determined through conventional analysis means, such as SIMS.

When the p-type impurity is caused to coexist with hydrogen so as to electrically inactivate the region, forward voltage (Vf) and threshold voltage (Vth) are considered to increase. However, since the layer thickness is very small, these voltages are not actually affected. The inner portion of the p-type layer has a percent thickness of 40% to 99.9% with respect to the total thickness of the p-type layer, particularly preferably 70% to 99.9%. The interface between the inner portion and the top portion of the p-type layer is a sub-layer having ⅔ the maximum hydrogen concentration of the p-type layer, and is determined through SIMS.

According to the conventional heating means, hydrogen remaining in the p-type layer in the form of an electrically inactive complex with the p-type impurity is removed from the layer as much as possible. The technical means according to the present invention is completely different from the conventional heating means in that hydrogen is caused to remain in a specific amount in the inner portion.

In the present invention, a layer containing a p-type impurity is formed through addition of the p-type impurity to the layer, and the formed layer is cooled at a controlled cooling rate in an atmosphere predominantly containing an inert gas, whereby a region in which a specific amount of hydrogen remains can be formed. In the case where the cooling starting temperature is equal to the temperature at which the layer containing the p-type impurity has been formed, the greater the cooling rate, the thinner the region in which hydrogen is intentionally caused to remain. At a given cooling rate, the higher the cooling starting temperature, the thinner the region in which hydrogen is intentionally caused to remain.

The layer containing a p-type impurity may be cooled also in a mixed gas atmosphere, for example, a mixture of hydrogen ($H_2$) with an inert gas, such as nitrogen ($N_2$), argon (Ar) or helium (He). Through increase in hydrogen content by volume of the atmosphere, the thickness of the region in which hydrogen is intentionally caused to remain can be increased. However, the hydrogen content by volume is preferably 40% or less. When the hydrogen content is excessively large, the amount of hydrogen captured in the layer containing a p-type impurity increases. In this case, the thickness of the region in which hydrogen is caused to remain is difficult to control favorably.

The thickness of the region (inner portion) in the p-type layer in which hydrogen is caused to remain in a specific amount varies depending on cooling starting temperature, cooling rate, composition of the atmosphere, form of a cooling apparatus, etc. Therefore, these conditions are not predetermined definitely. When an Mg-doped GaN layer is cooled from 1,050° C. that is the growth temperature thereof to room temperature in a mixed gas atmosphere of 95-vol. % nitrogen and 5-vol. % hydrogen, the cooling rate is generally controlled to 40° C./min to 300° C./min so as to form the region according to the present invention in which hydrogen is caused to remain. In the case of an aluminum (Al)-containing layer (e.g., $Al_xGa_yN$ ($0\leq X, Y \leq 1$, $X+Y=1$)), the cooling rate may be decreased.

Even when the cooling rate and the composition of the atmosphere gas in which cooling is performed are modified, distribution of the p-type impurity concentration in the p-type layer is not changed. Thus, if the dependency of percent decrease of hydrogen contained in the layer on cooling rate or other such a characteristic is investigated in advance, the cooling rate or other conditions can be controlled on the basis of the percent decrease, whereby a region having an atomic concentration ratio of p-type impurity to hydrogen of about 1:1 can be formed in the inner portion of the p-type layer.

If hydrogen is completely caused to remain in the p-type layer, formation of an ohmic electrode of low contact resistance is affected. Therefore, when the p-type layer is employed, for example, as a contact layer for forming an ohmic electrode, the p-type layer is preferably formed of an inner portion containing a region in which hydrogen is caused to remain and the top portion exhibiting low resistance.

In the p-type contact layer for forming a p-type ohmic electrode, in the p-type layer for forming pn junction with an n-type GaN-based semiconductor layer for attaining low forward voltage or in a similar layer, the hydrogen atom content of the top portion is preferably controlled to ⅓ or less the content of hydrogen caused to remain in the inner portion of the layer. Through decreasing of the remaining hydrogen concentration, a low-resistance top portion of the p-type layer can be formed.

A low-resistance region containing a large amount of p-type impurity electrically activated through decrease in hydrogen atom concentration is effectively formed in the top portion of the p-type layer through cooling in an atmosphere exclusively containing inert gas. For example, cooling in an atmosphere consisting of nitrogen, argon or helium is effective to form the low-resistance region. In a specific procedure, a layer containing a p-type impurity is grown through MOCVD in a hydrogen atmosphere, and then the formed layer is cooled in an atmosphere predominantly containing nitrogen instead of hydrogen, whereby the low-resistance region can be formed. Accordingly, when a region containing a large amount of hydrogen atoms is formed in the inner portion of the p-type layer in an atmosphere containing hydrogen at the aforementioned preferred ratio, followed by cooling the layer in an atmosphere predominantly containing an inert gas, the formed p-type layer includes an inner portion serving as a high-resistance region in which a large amount of hydrogen atoms are caused to remain and a top portion serving as a low-resistance region and having a hydrogen atom concentration ⅓ or less that of the region in the inner portion.

The cooling rate during formation of a low-resistance region in the top portion of the p-type layer is preferably greater than that employed during formation of a region in the inner portion in which a large amount of hydrogen atoms are caused to remain. Although cooling for forming a low-resistance layer in the top portion of the p-type layer might be performed in an atmosphere predominantly containing a compound of hydrogen and nitrogen (e.g., ammonia ($NH_3$)), this approach is not preferred, since hydrogen atoms released from the compound through scission of hydrogen-nitrogen bonds may be incorporated into the top portion of the p-type layer during cooling.

Hydrogen which is caused to remain in the GaN-based semiconductor layer containing a p-type impurity without being removed to the outside can provide a high-resistance region in the layer.

The high-resistance region that is formed by virtue of hydrogen which is caused to remain in the GaN-based semiconductor layer containing a p-type impurity can diffuse device operation current in the entire surface of the light-emitting layer.

The high-resistance region that is formed by virtue of hydrogen which is caused to remain in the GaN-based semiconductor layer containing a p-type impurity can inhibit short-circuit-like flow of device operation current into the light-emitting layer.

EXAMPLE 1

The present invention will next be described in detail by way of Example 1, in which a GaN-based semiconductor LED was fabricated from a p-type GaN-based semiconductor layer including a region in which hydrogen is intentionally caused to remain.

Figure 2:
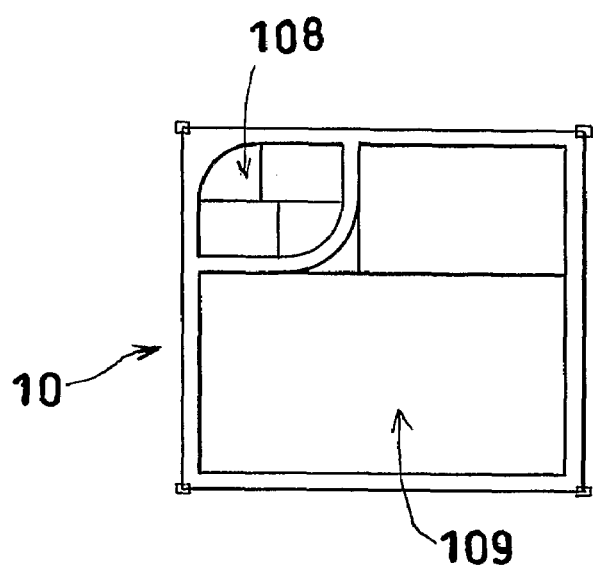
FIG. 2 is a schematic plan view of the LED described in Example 1.

FIG. 1 is a schematic cross-sectional view showing an epitaxial structure 11 employed for producing an LED 10 described in Example 1. FIG. 2 is a plan view of the LED 10.

The stacked structure 11 included a substrate 101 formed of sapphire having a c-plane ((0001) crystal plane) and on the c-plane, the following layers were sequentially formed: an undoped GaN layer (thickness: 2 μm) 102; a silicon (Si)-doped n-type GaN layer (thickness: 2 μm, carrier concentration: $1×10^{19}$ cm$^{-3}$) 103; an Si-doped n-type $Al_{0.07}Ga_{0.93}N$ cladding layer (thickness: 12.5 nm, carrier concentration: $1×10^{18}$ cm$^{-3}$) 104; a light-emitting layer 105 of a multi-quantum well structure including six Si-doped GaN barrier layers (thickness: 14.0 nm, carrier concentration: $1×10^{18}$ cm$^{-3}$) and five undoped $In_{0.20}Ga_{0.80}N$ well layers (thickness: 2.5 nm); an Mg-doped p-type $Al_{0.07}Ga_{0.93}N$ cladding layer 106 (thickness: 10 nm) 106; and an Mg-doped GaN contact layer 107 (thickness: 100 nm). These layers 102 to 107 of the stacked structure 11 were grown through conventional reduced-pressure MOCVD means.

Among them, the Mg-doped GaN contact layer 107 was grown through the procedure comprising adjusting the pressure inside the growth reactor furnace after completion of the growth of the Mg-doped $Al_{0.07}Ga_{0.93}N$ cladding layer 106 to $2×10^4$ Pa, starting vapor-phase growth of an Mg-doped GaN layer from trimethylgallium and ammonia serving as sources and biscyclopentamagnesium (bis-$Cp_2Mg$) serving as an Mg-dopant at 1,050° C., continuously supplying trimethylgallium, ammonia and the Mg-dopant to a growth reaction furnace for four minutes to form an Mg-doped GaN layer having a thickness of 0.1 μm, and stopping supply of trimethylgallium and bis-$Cp_2Mg$ to the growth reactor furnace to thereby terminate the growth of the Mg-doped GaN layer.

Immediately after completion of vapor-phase growth of the Mg-doped GaN layer serving as the contact layer 107, operation of a high-frequency induction heater that had been employed for heating the substrate 101 was stopped. Cooling of the stacked structure 11 including the vapor-phase-grown component layers 102 to 107 was then started in the growth reactor furnace. During cooling of the stacked structure 11, the employed atmosphere contained nitrogen and the hydrogen carrier gas employed for growing the component layers of the stacked structure 11 at a ratio by volume of 95:5. In the atmosphere, the substrate was cooled to room temperature for 20 minutes. Thus, the average cooling rate was 53° C./min.

After cooling to room temperature, the stacked structure 11 was removed from the growth reactor furnace, and the magnesium atom concentration and the hydrogen atom concentration of the Mg-doped GaN layer serving as the contact layer 107 were quantitatively determined through conventional SIMS. The Mg atom concentration was found to be $7×10^{19}$ cm$^{-3}$, and the concentration was virtually uniform from the top to the bottom in the depth direction. The hydrogen atom concentration of the top portion was found to be about $2×10^{19}$ cm$^{-3}$, which is smaller than the Mg atom concentration. However, the hydrogen atom concentration of the inner portion, which is located beneath the portion from the top surface to 30 nm depth (top portion 107-2), was found to be $6×10^{19}$ cm$^{-3}$ and almost uniformly distributed. The results indicate that a region having an atomic concentration ratio of Mg to hydrogen of about 1:1 was formed in the inner portion 107-1 of the Mg-doped p-type GaN layer 107 from the junction interface between the layers 106 and 107 to 70 nm-depth. The resistance of the region was estimated to be about 2 kΩ from the current-voltage (I-V) characteristics.

The LED 10 was fabricated from the epitaxial layer structure 11 having the aforementioned p-type layer serving as the contact layer 107. Firstly, the region of the structure where an n-type ohmic electrode 108 was to be formed was dry-etched in a typical manner, thereby exposing the above region of the Si-doped GaN layer 103. On the exposed surface, the n-type ohmic electrode 108 (of a double layer structure of titanium (Ti) and aluminum (Al)) was formed. Other than the n-type ohmic electrode area, a p-type ohmic electrode 109 was formed on virtually entire surface of the contact layer 107 including a region in which hydrogen was intentionally caused to remain. The p-type ohmic electrode 109 had a multilayer structure of platinum (Pt) film, rhodium (Rh) film and gold (Au) film and a function of reflecting light emitted from the light-emitting layer toward the sapphire substrate 101. The Pt film was in contact with the surface of the p-type contact layer 107.

After formation of the p-type and n-type ohmic electrodes 108 and 109, the backside of the sapphire substrate 101 was polished by use of abrasive grains, such as diamond particles, to thereby form a mirror-finished surface. Then, the stacked structure 11 was cut into square (350 μm×350 μm) LED 10 pieces. Each chip was sub-mounted via the ohmic electrodes 108 and 109, thereby forming a flip-chip piece. The piece was placed on a lead frame and wire-bonded to the lead frame with gold (Au) wire.

Electric characteristics and emission characteristics of the flip-chip LEDs were evaluated when forward current was caused to flow between the p-type ohmic electrode 108 and the n-type ohmic electrode 109. The forward voltage (Vf) at a forward current of 20 mA was found to be 3.2 V. The light emitted through the sapphire substrate 101 to the outside had a wavelength of 455 nm. The output of the emitted light, as determined through a typical integrating sphere, was 10 mW. These characteristics were attained with uniformity from LED to LED among about 10,000 LEDs (products with defective appearance were not included as such had been rejected in advance) formed on virtually the entirety of the circular substrate 101 (diameter: 2 inches).

Each LED 10 was subjected to a simple electrostatic breakdown test. Pulse voltage was instantaneously applied to the electrodes for simulating instantaneous application of static electricity to the LED, and occurrence of short between the electrodes in the reverse direction was investigated. As a result, among 100 test chips, only one LED chip was broken upon application of pulse voltage of 1,000 V. That is, percent failure with respect to reverse voltage (Vr) was 1%.

COMPARATIVE EXAMPLE

In Comparative Example, the Mg-doped p-type GaN contact layer was formed through a post-growth treatment method different from that employed in Example 1 above. The same stacked structure as employed in Example 1 was formed through the same procedure and under the same conditions as employed in Example 1. Subsequently, the stacked structure was cooled to 350° C. while hydrogen serving as a carrier gas employed during vapor phase growth was continuously supplied. The stacked structure was then cooled to room temperature. The thus cooled structure was placed in a heating furnace that is different from the furnace employed in vapor phase growth and maintained at 900° C. for one minute under nitrogen. The typically employed heat treatment for electrically activating the p-type impurity was performed.

The hydrogen atom concentration of the Mg-doped p-type GaN layer of Comparative Example, determined through conventional SIMS, was found to be about 1/100 or less the magnesium atom concentration ($7×10^{19}$ cm$^{-3}$). Accordingly, a region having a particularly high hydrogen concentration was not observed in the p-type layer. Subsequently, the epitaxial stacked structure was processed and mounted in the same manner as employed in Example 1 to thereby fabricate LED chips. The same layer combination and plan-view shape of the n-type and p-type ohmic electrodes as those of Example 1 were employed.

Each of the fabricated LED chips exhibits the same electric and emission characteristics as described in Example 1. However, in the same electrostatic breakdown test, 50 LED chips were broken upon application of pulse voltage of 100 V among 100 test chips. All the 50 LED chips that had not caused reverse blocking voltage failure upon instantaneous application of low voltage of 100 V were electrically broken in the electrostatic breakdown test at 1,000 V.

The essential difference between the LED of Example 1 and the LED of Comparative Example is whether a region in which hydrogen was caused to remain was formed in the Mg-doped p-type GaN layer or not. As described above, the electrostatic breakdown test results of the LEDs of Comparative Example were considerably poor. This indicates that the p-type GaN-based semiconductor layer including a region in which hydrogen is caused to remain can provide an LED exhibiting excellent electrostatic blocking voltage.

EXAMPLE 2

The present invention will next be described in detail by way of Example 2, in which the same stacked structure as described in Example 1 was cooled through a technique which is different from that employed in Example 1 for fabricating an LED.

Immediately after completion of vapor-phase growth of the Mg-doped GaN layer serving as the contact layer 107, operation of a high-frequency induction heater that had been employed for heating the substrate 101 was stopped. Cooling of the stacked structure 11 shown in FIG. 1 including the vapor-phase-grown component layers 102 to 107 was then started from 1,050° C. in the growth reactor furnace. During cooling of the stacked structure 11, the employed atmosphere contained nitrogen and the hydrogen carrier gas employed for growing the component layers of the stacked structure 11 at a ratio by volume of 95:5. The stacked structure was cooled from 1,050° C. to 800° C. at a cooling rate of 70° C./min.

From 800° C. to 600° C., cooling was performed in an atmosphere exclusively containing nitrogen at a constant cooling rate. The substrate was then cooled to room temperature for 20 minutes. Thus, the average cooling rate was 85° C./min.

After cooling to room temperature, the stacked structure 11 was removed from the growth reactor furnace, and the magnesium atom concentration and the hydrogen atom concentration of the Mg-doped GaN layer serving as the contact layer 107 were quantitatively determined through conventional SIMS. The magnesium atom concentration was found to be $7×10^{19}$ cm$^{-3}$, and the concentration was virtually uniform from the top to the bottom in the depth direction. The hydrogen atom concentration of the top portion was found to be drastically reduced to about $5×10^{18}$ cm$^{-3}$, while the hydrogen atom concentration of the inner portion, which is located beneath the portion from the top surface to 30 nm-depth, was found to be $6×10^{19}$ cm$^{-3}$ and almost uniformly distributed. Thus, a region having an atomic concentration ratio of Mg to hydrogen of about 1:1 was formed in the inner portion of the Mg-doped p-type GaN layer 107 from the junction interface between the layers 106 and 107 to 70 nm depth. The top portion was a low-resistance region having a hydrogen atom concentration less than 1/10 that of the inner portion. The resistance of the region was estimated to be about 1 kΩ or less from the current-voltage (I-V) characteristics.

Similarly to Example 1, electric characteristics and emission characteristics of the flip-chip LEDs as shown in FIG. 2 were evaluated when forward current was caused to flow between the n-type ohmic electrode 108 and the p-type ohmic electrode 109. The forward voltage (Vf) at a forward current of 20 mA was found to be 3.0 V, which was lower than that of the LED chip of Example 1. The light emitted through the sapphire substrate 101 to the outside had a wavelength of 455 nm. The output of the emitted light, as determined through a typical integrating sphere, was 12 mW. These characteristics ere attained with uniformity from LED to LED among about 10,000 LEDs (products with defective appearance were not included as such had been rejected in advance) formed on virtually the entirety of the circular substrate 101 (diameter: 2 inches).

Each LED 10 was subjected to a simple electrostatic breakdown test. Pulse voltage was instantaneously applied to the electrodes for simulating instantaneous application of static electricity to the LED, and occurrence of short between the electrodes in the reverse direction was investigated. As a result, among 100 test chips, only one LED chip was broken upon application of pulse voltage of 1,000 V. That is, percent failure with respect to reverse voltage (Vr) was 1%.

INDUSTRIAL APPLICABILITY

The semiconductor device of the present invention is used in a light-emitting (e.g., blue-, green-, or UV-emitting) diode, a laser diode, a pin-type photodetector or a similar device.

The invention claimed is:

1. A gallium nitride-based semiconductor device having a p-type layer that is a gallium nitride compound semiconductor layer containing a p-type impurity and exhibiting p-type conduction, wherein the p-type layer comprises a top portion and an inner portion located under the top portion, wherein the inner portion contains the p-type impurity element and, in combination therewith, hydrogen, and wherein the top portion of the p-type layer has a hydrogen content that is less than the amount of the hydrogen contained in the inner portion.

2. A gallium nitride-based semiconductor device according to claim 1, wherein the p-type impurity is incorporated in the p-type layer by means of doping or ion injection.

3. A gallium nitride-based semiconductor device according to claim 1, wherein the inner portion of the p-type layer has a ratio of atomic concentration of the hydrogen to that of the p-type impurity of about 1:1.

4. A gallium nitride-based semiconductor device according to claim 1, wherein the inner portion of the p-type layer has a percent thickness of 40% to 99.9% with respect to a total thickness of the p-type layer.

5. A gallium nitride-based semiconductor device according to claim 4, wherein the inner portion of the p-type layer has a percent thickness of 70% or more with respect to the total thickness of the p-type layer.

6. A gallium nitride-based semiconductor device according to claim 1, wherein the top portion of the p-type layer has a hydrogen content that is ⅓ or less the amount of the hydrogen contained in the inner portion.

7. A gallium nitride-based semiconductor device according to claim 1, wherein the top portion of the p-type layer has a hydrogen content that is ½ or less the amount of the hydrogen contained in the inner portion.

8. A gallium nitride-based semiconductor device according to claim 1, wherein the top portion of the p-type layer has a hydrogen content that is ⅔ or less the amount of the hydrogen contained in the inner portion.

* * * * *